US011600581B2

(12) United States Patent
Herbsommer et al.

(10) Patent No.: US 11,600,581 B2
(45) Date of Patent: Mar. 7, 2023

(54) PACKAGED ELECTRONIC DEVICE AND MULTILEVEL LEAD FRAME COUPLER

(71) Applicant: Texas Instruments Incorporated, Dallas, TX (US)

(72) Inventors: Juan Alejandro Herbsommer, Allen, TX (US); Hassan Omar Ali, Murphy, TX (US); Baher Haroun, Allen, TX (US); Yigi Tang, Allen, TX (US); Rajen Manicon Murugan, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 50 days.

(21) Appl. No.: 17/231,897

(22) Filed: Apr. 15, 2021

(65) Prior Publication Data
US 2022/0336383 A1 Oct. 20, 2022

(51) Int. Cl.
*H01L 23/66* (2006.01)
*H01L 21/48* (2006.01)
*H01L 23/495* (2006.01)

(52) U.S. Cl.
CPC .......... *H01L 23/66* (2013.01); *H01L 21/4821* (2013.01); *H01L 23/49534* (2013.01); *H01L 2223/6677* (2013.01)

(58) Field of Classification Search
CPC .......... H01L 21/4821; H01L 23/49534; H01L 23/66; H01L 2224/48221; H01L 2224/48148; H01L 2223/6677
See application file for complete search history.

(56) References Cited

U.S. PATENT DOCUMENTS

| 3,388,339 | A  | 6/1968  | Malnar et al. |
| 8,217,724 | B2 | 7/2012  | Briggs et al. |
| 8,624,682 | B2 | 1/2014  | Ridley et al. |
| 8,680,854 | B2 | 3/2014  | Dyer et al. |
| 8,836,327 | B2 | 9/2014  | French et al. |
| 8,906,470 | B2 | 12/2014 | Overstolz et al. |
| 9,201,404 | B2 | 12/2015 | Harasaka et al. |
| 9,529,334 | B2 | 12/2016 | Herbsommer et al. |
| 10,424,523 | B2 | 9/2019  | Fruehling et al. |
| 2005/0007118 | A1 | 1/2005 | Kitching et al. |

(Continued)

OTHER PUBLICATIONS

PCT Intl Search Report No. PCT/US2022/024520, dated Jul. 25, 2022, 3 pgs.

*Primary Examiner* — Brook Kebede
(74) *Attorney, Agent, or Firm* — Ronald O. Neerings; Frank D. Cimino

(57) ABSTRACT

A packaged electronic device includes a multilayer lead frame having first and second trace levels, a via level therebetween, a conductive feed structure, and a conductive reflector wall. The first trace level includes a conductive coupler antenna and a conductive ground structure that extends in a plane of orthogonal first and second directions, and a portion of the conductive coupler antenna faces outward along a third direction orthogonal to the first and second directions. The conductive reflector wall has an opening and extends along the third direction between the first and second trace levels around a portion of the conductive coupler antenna. The conductive feed structure is coupled to the conductive coupler antenna and extends along the first direction through the opening of the conductive reflector wall.

20 Claims, 11 Drawing Sheets

(56) References Cited

U.S. PATENT DOCUMENTS

| | | |
|---|---|---|
| 2005/0271250 A1 | 12/2005 | Vallone et al. |
| 2006/0022761 A1 | 2/2006 | Abeles et al. |
| 2006/0261252 A1* | 11/2006 | Cole ................. H01L 31/02162 |
| | | 250/226 |
| 2007/0164907 A1* | 7/2007 | Gaucher .................. H01Q 1/38 |
| | | 343/700 MS |
| 2007/0247241 A1 | 10/2007 | Bruan et al. |
| 2010/0156547 A1 | 6/2010 | McGuyer et al. |
| 2010/0189605 A1 | 7/2010 | Schmid et al. |
| 2011/0128082 A1 | 6/2011 | Maki et al. |
| 2011/0147367 A1 | 6/2011 | Borwick, III et al. |
| 2013/0015850 A1 | 1/2013 | Lindorfer et al. |
| 2013/0021208 A1 | 1/2013 | Seok et al. |
| 2013/0026586 A1 | 1/2013 | Seok et al. |
| 2013/0044921 A1 | 2/2013 | In et al. |
| 2013/0059551 A1 | 3/2013 | Ginsburg et al. |
| 2013/0147472 A1 | 6/2013 | French et al. |
| 2013/0176703 A1 | 7/2013 | Hopper et al. |
| 2014/0285289 A1 | 9/2014 | Herbsommer et al. |
| 2014/0287701 A1 | 9/2014 | Herbsommer et al. |
| 2014/0287703 A1 | 9/2014 | Herbsommer et al. |
| 2014/0347074 A1 | 11/2014 | Nadeau |
| 2014/0368377 A1 | 12/2014 | Nadeau et al. |
| 2014/0373599 A1 | 12/2014 | Trombley et al. |
| 2015/0001694 A1 | 1/2015 | Hopper et al. |
| 2015/0027908 A1 | 1/2015 | Parsa et al. |
| 2015/0028866 A1* | 1/2015 | Parsa ........................ G04F 5/14 |
| | | 324/252 |
| 2015/0084707 A1 | 3/2015 | Maki |
| 2015/0244382 A1 | 8/2015 | Ishihara |
| 2015/0277386 A1 | 10/2015 | Passilly et al. |
| 2015/0280320 A1 | 10/2015 | Haroun et al. |
| 2015/0295305 A1 | 10/2015 | Herbsommer et al. |
| 2016/0276731 A1 | 9/2016 | Seok et al. |
| 2016/0233178 A1 | 11/2016 | Lamy et al. |
| 2017/0093010 A1 | 3/2017 | Herbsommer et al. |
| 2018/0156875 A1 | 6/2018 | Herbsommer et al. |
| 2019/0152773 A1 | 5/2019 | Herbsommer et al. |
| 2019/0334220 A1 | 10/2019 | Mi et al. |
| 2019/0346814 A1 | 11/2019 | Fruehling et al. |
| 2020/0241480 A1 | 7/2020 | Bahr et al. |
| 2020/0403299 A1 | 12/2020 | Gupta et al. |

* cited by examiner

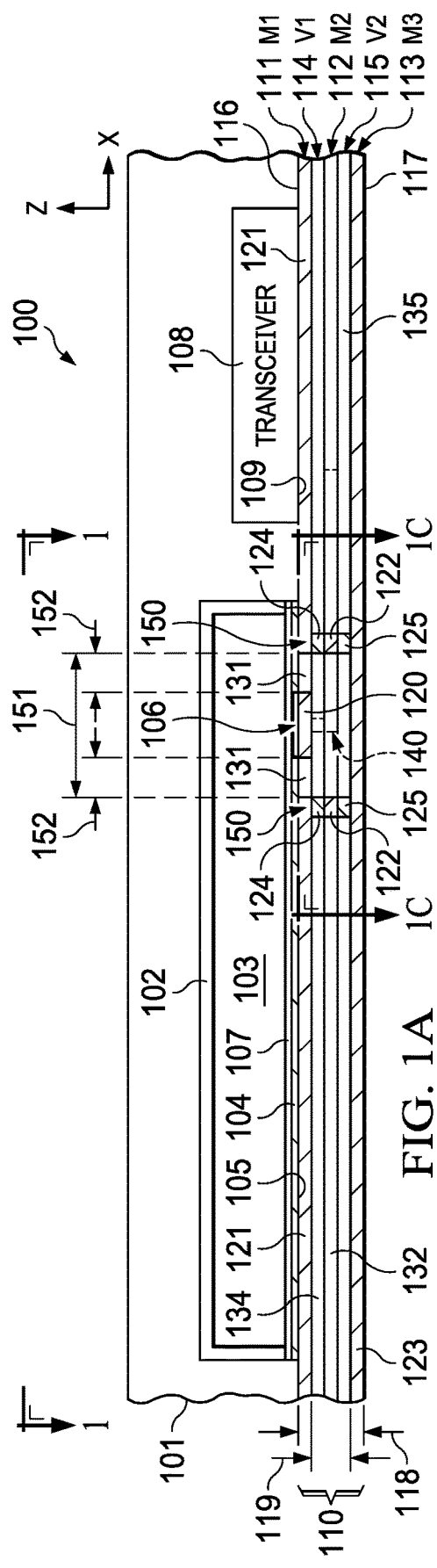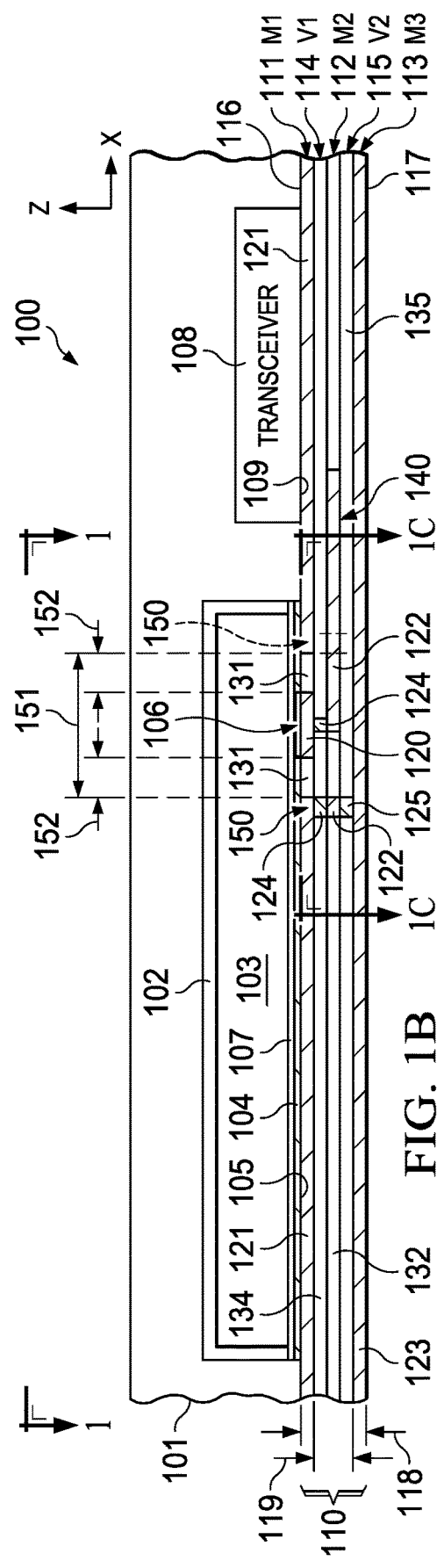

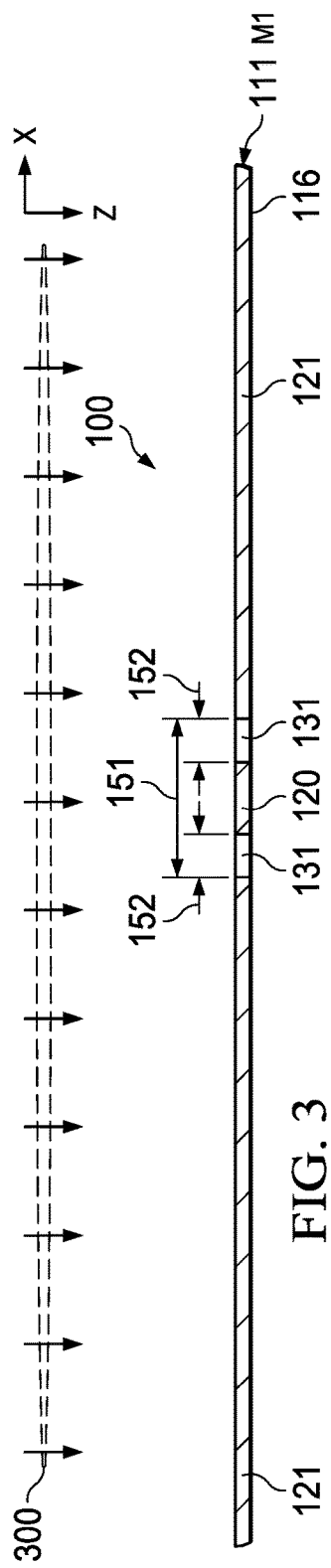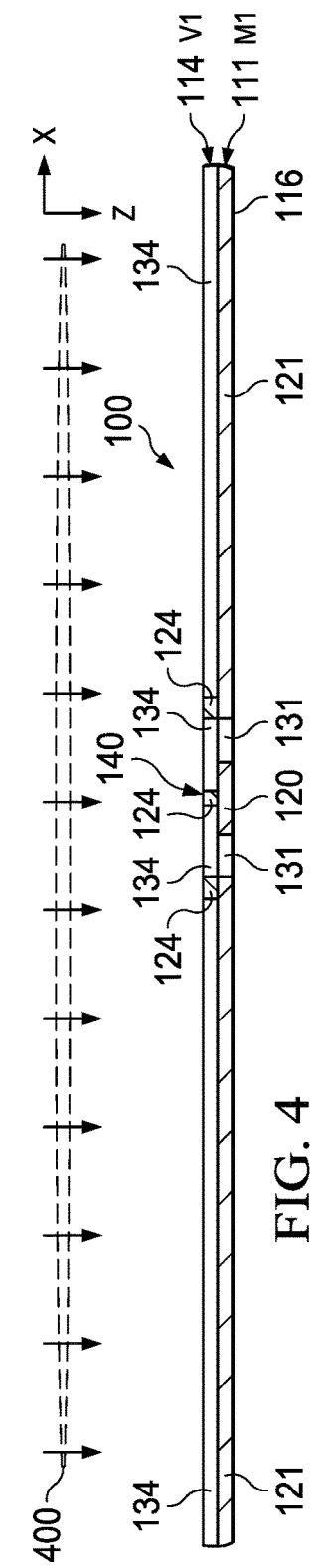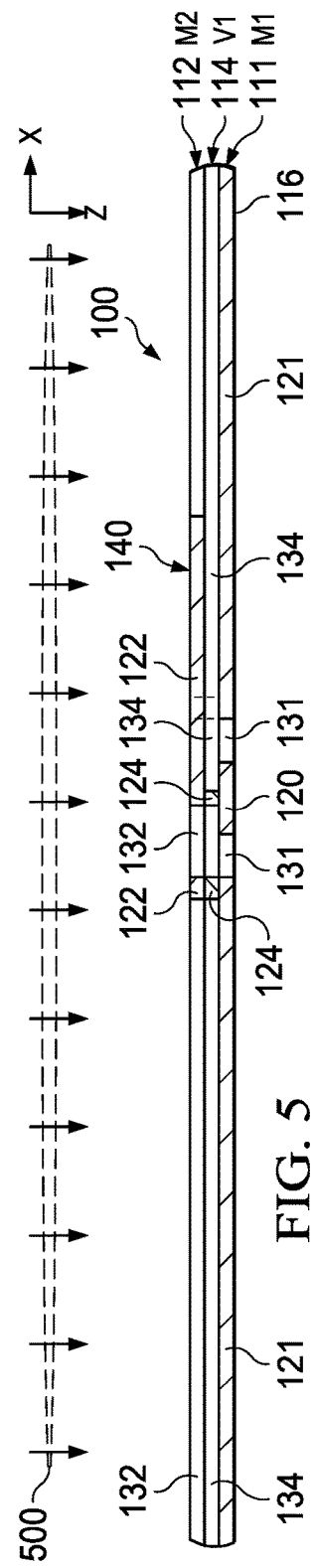

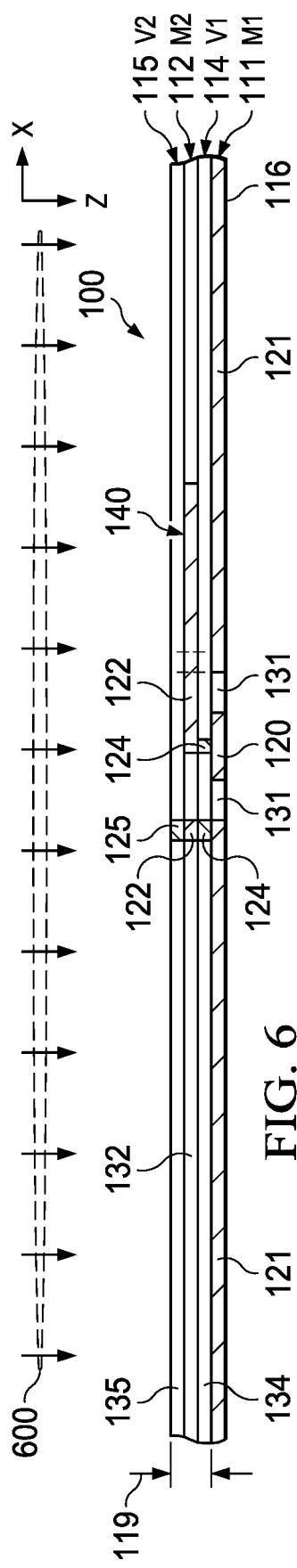

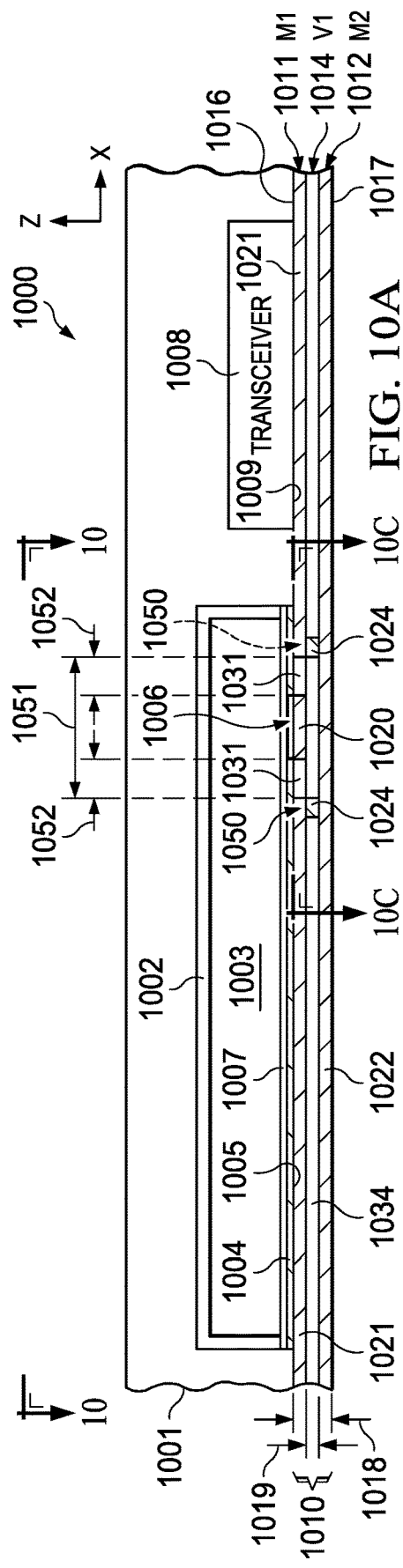
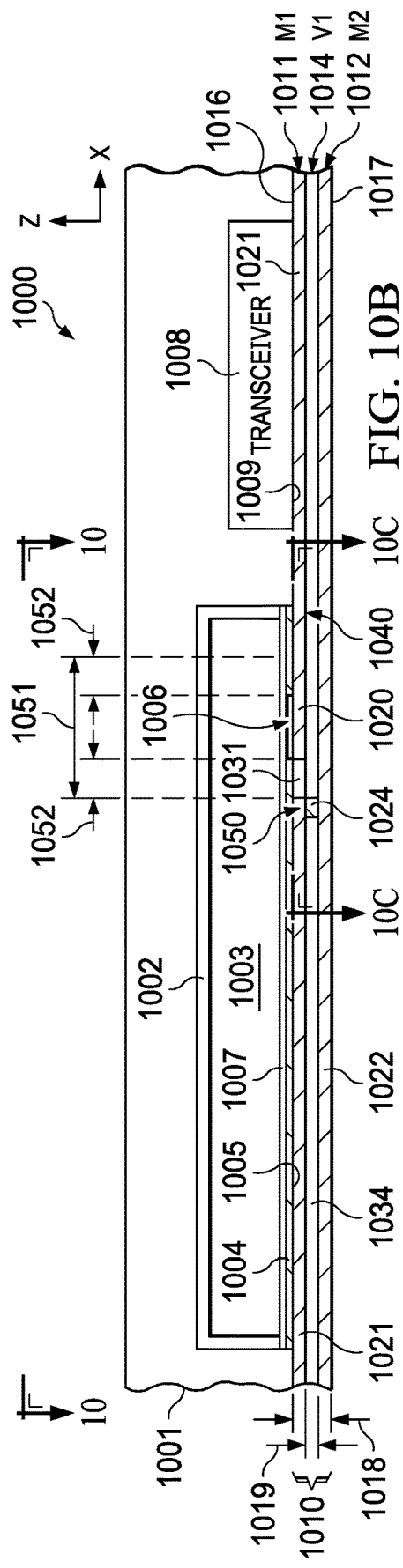
FIG. 10A
FIG. 10B

PACKAGED ELECTRONIC DEVICE AND MULTILEVEL LEAD FRAME COUPLER

BACKGROUND

In the microwave to millimeter wave (mm-wave) region, molecular spectroscopy is useful for constructing microwave or millimeter wave atomic or molecular clocks and other systems that require accurate timing signals having wavelengths λ in the mm range. The mm-wave frequency spectrum lies between microwave and infrared waves with frequencies between about 30 GHz and 300 GHz. Millimeter wave atomic clocks can be implemented with a dipolar gas in a physics cell coupled to a transceiver (or separate transmitter and receiver). Atomic clocks excite the gas within a physics or gas cell using a mm-wave radiation induced by a RF transceiver, and the system detects the rotational quantum transition of dipolar molecules for a reference. Certain gas molecules (e.g., water or $H_2O$) have defined quantum rotational state transitions, and such molecules absorb energy at a very repeatable frequency when transitioning between rotational states. For example, water absorbs energy based on quantum rotational state transitions around 183 GHz, and other physics cells (e.g., oxygen carbonil sulfide or OCS) have peak absorption around 121 GHz. An antenna can be used to couple a chip scale gas cell with transceiver circuitry, for example, to transmit a 121 GHz signal from a mm-wave transceiver to the antenna and to launch the same signal from a substrate package to a silicon physics cell to implement a cost effective and power efficient transition based atomic clock. The signal interrogates the gas in the physics cell to lock to a quantum rotational molecular transition for an atomic clock application. Efficient performance results when the antenna structure provides a coupling reflector at $\lambda/4$, but this requires a thick antenna or coupler substrate. In some applications, package size constraints limit the overall dimensions of antenna-in-package solutions, and it is desirable to provide a mm-wave package in a very thin package substrate.

SUMMARY

A packaged electronic device in one aspect includes a physics cell, a transceiver and a multilayer lead frame. The multilayer lead frame has first and second trace levels, a via level therebetween, a conductive feed structure, and a conductive reflector wall. The first trace level has a conductive coupler antenna and a conductive ground structure that extends in a plane of orthogonal first and second directions. A portion of the conductive coupler antenna faces a conductive layer opening of the physics cell along a third direction orthogonal to the first and second directions. The conductive reflector wall has an opening and extends along the third direction between the first and second trace levels around a portion of the conductive coupler antenna. The conductive feed structure is coupled to the conductive coupler antenna and extends along the first direction through the opening of the conductive reflector wall.

In another aspect, a multilayer lead frame includes first and second trace levels, a via level therebetween, a conductive feed structure, and a conductive reflector wall. The first trace level has first patterned conductive features, and the second trace level has second patterned conductive features. The via level includes conductive vias that interconnect respective ones of the first and second patterned conductive features. The first trace level includes a conductive coupler antenna and a conductive ground structure that extends along the first side in a plane of orthogonal first and second directions. A portion of the conductive coupler antenna faces outward along a third direction that is orthogonal to the first and second directions. The conductive reflector wall has an opening and extends along the third direction between the first trace level and the second trace level. The conductive reflector wall extends around a portion of the conductive coupler antenna. The conductive feed structure is coupled to the conductive coupler antenna and extends along the first direction through the opening of the conductive reflector wall.

In another aspect, a method of fabricating a packaged electronic device includes forming a first trace level of a multilayer lead frame, forming a via level on the first trace level and forming a second trace level on the via level. The first trace level has first patterned conductive features and an insulator portion between the first patterned conductive features. The first patterned conductive features include a conductive coupler antenna and a conductive ground structure that extends in a plane of a first direction and an orthogonal second direction. The conductive coupler antenna has a portion that faces outward from a first side of the multilayer lead frame along a third direction. The via level has conductive vias and another insulator portion between the conductive vias. The second trace level has second patterned conductive features and a further insulator portion between the second patterned conductive features. The method includes forming a conductive feed structure coupled to the conductive coupler antenna and extending along the first direction. The method includes forming a conductive reflector wall having an opening. The conductive reflector wall extends along the third direction between the first trace level and the second trace level, the conductive reflector wall extends around a portion of the conductive coupler antenna, and the conductive feed structure extends along the first direction through the opening of the conductive reflector wall.

BRIEF DESCRIPTION OF THE DRAWINGS

FIG. 1A is a partial sectional side elevation view taken along line 1A-1A in FIG. 1.

FIG. 1B is a partial sectional side elevation view taken along line 1B-1B in FIG. 1.

FIGS. 3-9 are partial sectional side elevation views of the packaged electronic device of FIGS. 1-1C undergoing fabrication according to the method of FIG. 2.

FIG. 10A is a partial sectional side elevation view taken along line 10A-10A in FIG. 10.

FIG. 10B is a partial sectional side elevation view taken along line 10B-10B in FIG. 10.

DETAILED DESCRIPTION

Figure 1:
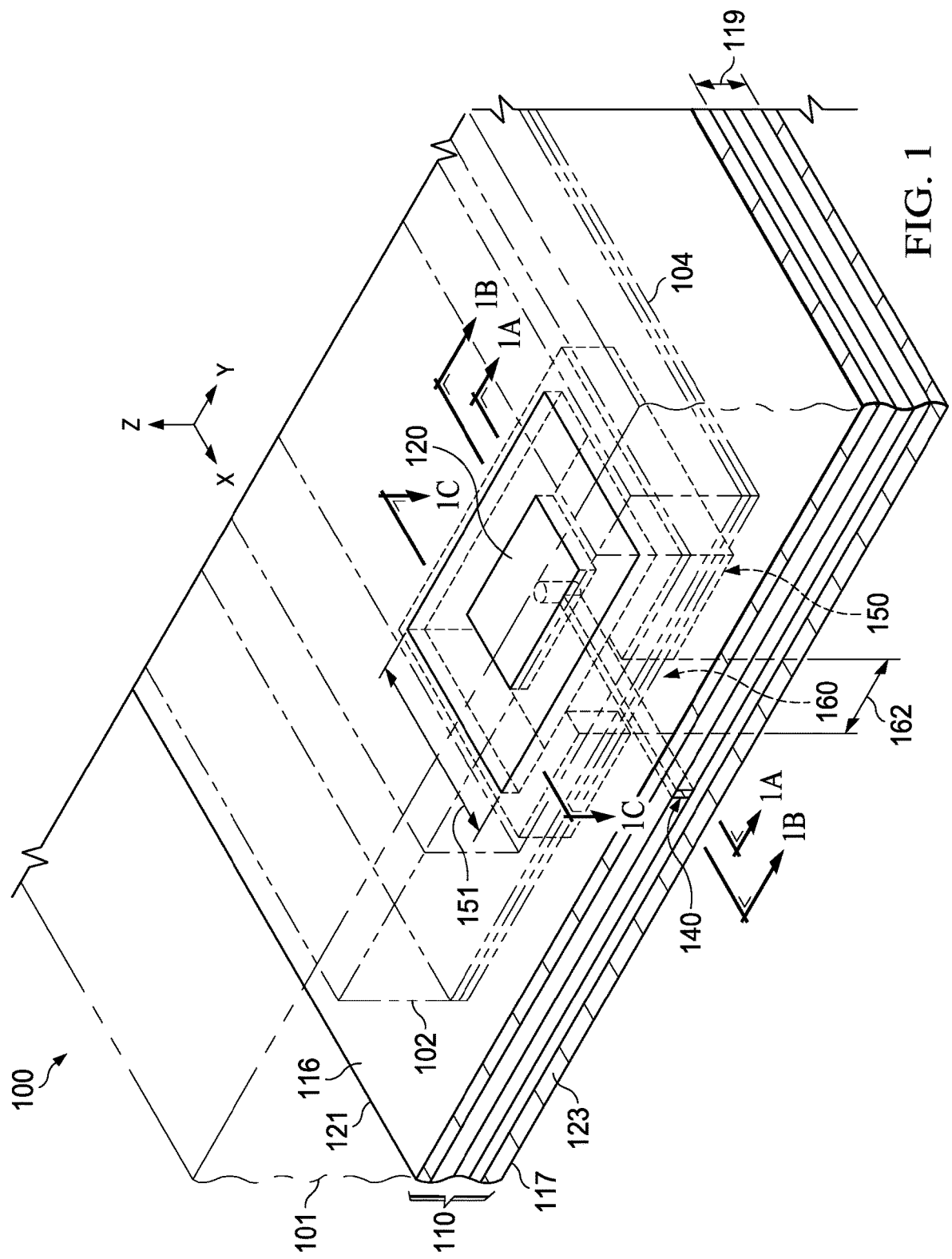
FIG. 1 is a perspective view of a mm wave clock packaged electronic device with a multilayer lead frame coupler.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 1C:
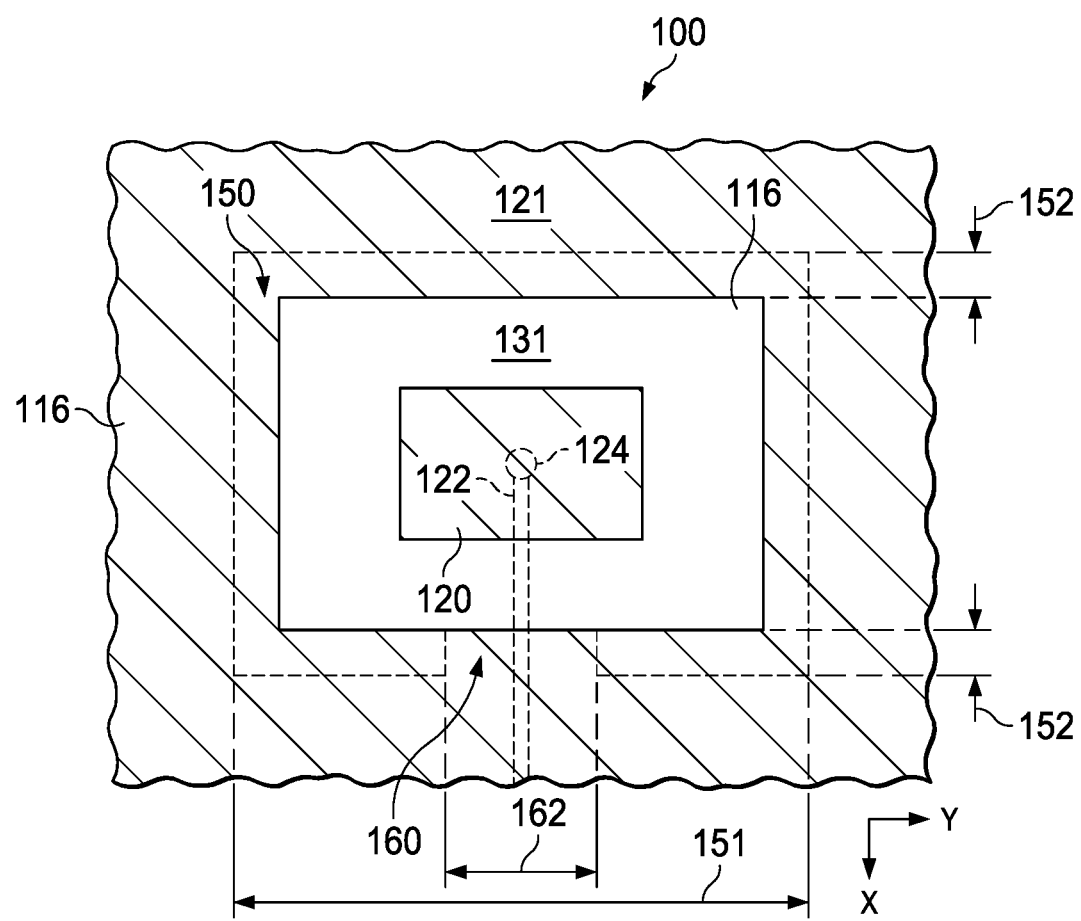
FIG. 1C is a partial sectional top view taken along line 1C-1C in FIGS. 1, 1A and 1B.

FIGS. 1 and 1A-1C show a mm wave clock packaged electronic device 100. FIG. 1 is a perspective view of the packaged electronic device 100, FIG. 1A shows a partial sectional side elevation view taken along line 1A-1A in FIG. 1, FIG. 1B shows another partial sectional side elevation view taken along line 1B-1B in FIG. 1 and FIG. 1C is a partial sectional top view taken along line 1C-1C in FIGS. 1, 1A and 1B. Portions of the packaged electronic device 100 are enclosed by a package structure 101, which can be a molded plastic material or a metallic shield. The example packaged electronic device 100 has a generally rectangular shape. For ease of illustration and discussion, the example packaged electronic device 100 is shown in a three-dimensional space defined by example mutually orthogonal directions or axis including a first direction (labeled X), an orthogonal second direction (labeled Y) and a third direction (labeled Z) that is orthogonal to the first and second directions. In the illustrated position, the top of the packaged electronic device 100 is spaced apart from a bottom of the packaged electronic device 100 along the third direction. The packaged electronic device 100 in this example has a rectangular profile with opposite lateral sides spaced apart from one another along the first direction X and front and back sides spaced apart from one another along the second direction Y. The device positioning in a three-dimensional coordinate system can be changed without affecting the structural relationships of the components and features.

The packaged electronic device 100 includes a physics cell 102 (e.g., FIGS. 1A and 1B) having a cavity 103 and a conductive layer 104 along a bottom side 105 of the physics cell 102. The conductive layer 104 has an opening 106 (e.g., an iris) along the bottom and a glass layer 107, shown in FIGS. 1A and 1B. The physics cell 102 in one example includes a semiconductor material, which can be or include silicon, with the cavity 103 formed therein. The physics cell 102 includes one or more metallization layers or levels that include(s) the conductive layer 104 and the opening 106 thereof. The packaged electronic device 100 also includes a transceiver 108 having a bottom side 109.

The packaged electronic device 100 includes a multilayer lead frame 110, which can be a routable lead frame. The multilayer lead frame 110 provides an integral antenna that couples a signal from a transmitter output of the transceiver 108 to a first port of the physics cell 102 and couples a second port of the physics cell 102 to receiver circuitry of the transceiver 108. The packaged electronic device 100 is configured to operate as a rotational transition based atomic clock that uses quantum defined rotational states of a dipolar molecule vapor in the cavity 103 of the physics cell 102. The quantum rotational states of the cavity gas occur at frequencies (e.g., 10 to 1000 GHz) in the mm wavelength range, and do not require optical components such as lasers, photo detectors, and lenses. In one example, the transceiver 108 is a low-cost mm wave CMOS transceiver that is configured to interrogate the physics cell 102 over a bandwidth which covers the corresponding quantum state transition. At the transition frequency, a detectable absorption minima determines an absolute frequency reference.

Figure 10:
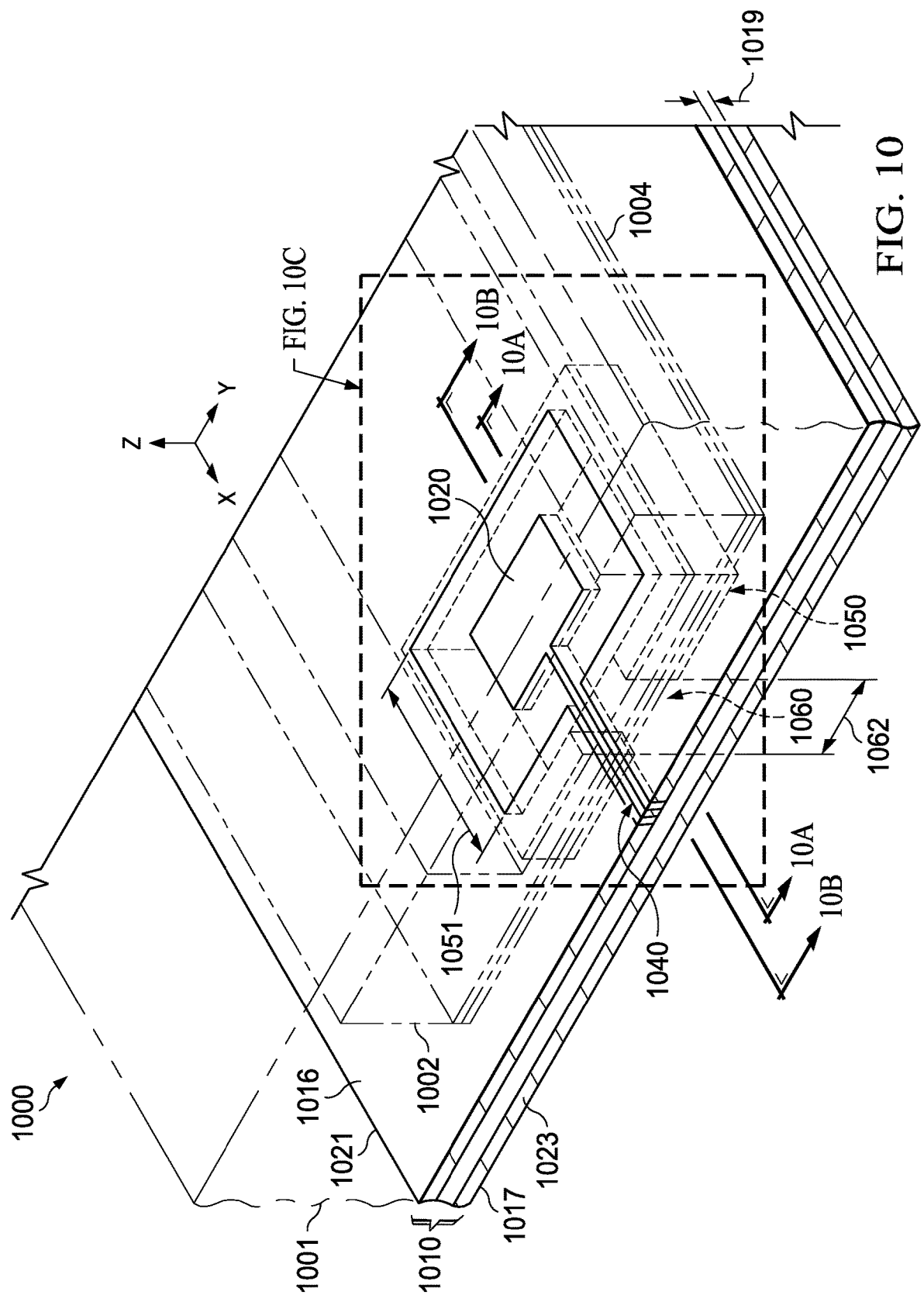
FIG. 10 is a perspective view of another mm wave clock packaged electronic device with a multilayer lead frame coupler.

The multilayer lead frame 110 in one example is a five-level structure including a first trace level 111 (e.g., a first metal layer M1), a second trace level 112 (e.g., a second metal layer M2), a third trace level 113 (e.g., a third metal layer M3), as well as a first via level 114 (e.g., V1) and a second via level 115 (e.g., V2). FIG. 10 below shows another example using a three-level lead frame structure. In one example, the patterned conductive features of the trace levels and conductive vias of the via levels are or include copper or other conductive metal. The multilayer lead frame 110 in FIGS. 1-1C has a first (e.g., top) side 116 and an opposite second (e.g., bottom) side 117. The respective bottom sides 105 and 109 of the physics cell 102 and the transceiver 108 are mounted to the first side 116 of the multilayer lead frame 110.

The packaged electronic device 100 in one example includes conductive leads (not shown) that are exposed on the bottom and one or more lateral sides. In practice, the leads are soldered to corresponding conductive pads of a host PCB (not shown) to mechanically mount the packaged electronic device 100 and to form electrical connections between circuitry of the PCB and one or more circuits or components of the packaged electronic device 100. In another implementation, the packaged electronic device includes one or more conductive leads exposed in the interior of the bottom side, such as in a grid array type (e.g., LGA or BGA) package. The multilayer lead frame 110 further includes an insulator in one or more levels thereof, such as multiple layers of Ajinomoto build-up film (ABF), for example 2-5 μm silica layers with epoxies.

The physics cell 102 and the transceiver 108 are configured to operate at a signal wavelength λ, which can be varied by a controller or processor (not shown) of the transceiver 108. The multilayer lead frame 110 has a lead frame thickness 118 along the third direction Z that is less than the signal wavelength λ divided by 4. In one example, the lead frame thickness 118 along the third direction Z is less than 250 μm, such as about 170 to 230 μm. As previously discussed, efficient operation of the atomic clock is enhanced where the coupling structure ensures a coupling reflector of λ/4. However, package size requirements for mm wavelengths would require tall coupler structures using a top and bottom ground configuration. In this regard, the distance λ/4 for an OCS physics cell gas would require a coupler thickness of more than 625 μm considering the non-zero thickness of the upper and lower conductor layers and would require a thickness greater than 408 μm for an $H_2O$ physics cell gas. The example five-level multilayer lead frame 110 includes a reflector wall structure to provide adequate atomic clock operating efficiency while achieving a significantly reduced coupler thickness 118 and allowing operation at mm wave frequencies, e.g., at or around 183 GHz for an $H_2O$ physics cell gas, 121 GHz for an OCS physics cell gas.

The multilayer lead frame 110 has conductive upper and lower ground planes separated from one another by a distance 119, which corresponds to a thickness of a conductive reflector wall structure described further below. The first trace level 111 has first patterned conductive features, including a conductive coupler antenna 120 (e.g., a patch antenna) and a conductive first ground structure 121. The conductive coupler antenna 120 and the conductive first ground structure 121 extend along respective portions of the first side 116 in a plane of the first and second directions (e.g., an X-Y plane). The conductive coupler antenna 120 has a portion that faces the opening 106 of the conductive layer 104 of the physics cell 102 along the third direction Z. The second trace level 112 has second patterned conductive features 122.

The third trace level 113 has third patterned conductive features 123, for example, a single conductive layer that provides a second ground plane. The first via level 114 extends between the first trace level 111 and the second trace level 112. The first via level 114 includes conductive first vias 124 that interconnect respective ones of the first and second patterned conductive features 121 and 122. The second via level 115 includes second conductive vias 125 and extends between the second trace level 112 and the third trace level 113. The third trace level 113 includes a second conductive ground structure 123 that extends in a second plane of the first direction X and the second direction Y. The second conductive ground structure 123 extends along the second side 117. The first conductive ground structure 121 and the second conductive ground structure 123 are parallel to one another. The second conductive vias 125 interconnect respective ones of the second and third patterned conductive features 122 and 123. In one implementation, the first trace level 111 includes one or more insulator (e.g., dielectric) portions 131, the second trace level 112 includes one or more insulator portions 132, the first via level 114 includes one or more insulator portions 134, and the second first via level 115 includes one or more insulator portions 135.

The second conductive features in the second trace level 112 of the example multilayer lead frame 110 include a conductive feed structure 140 (e.g., a coupler antenna). In one example, the conductive feed structure 140 is a stripline with a feeding conductor embedded in a dielectric with a generally continuous ground plane above and below the conductive feed. The conductive feed structure 140 in this example includes a via 124 (e.g., FIGS. 1A and 1C) in the first via level 114 that contacts the conductive coupler antenna 120 of the first trace level 111, and a laterally extending conductive feature 122 that extends laterally along the first direction X (e.g., to the left in FIG. 1B) from the via 124 and under the transceiver 108. The conductive feed structure 140 is configured to couple a signal at a port of the physics cell 102 from the conductive coupler antenna 120 to the transceiver 108. The conductive feed structure 140 is coupled by the via 124 in the first via level 114 to the conductive coupler antenna 120 of the first trace level 111. In one implementation, the other end of the conductive feed structure 140 is coupled to a terminal of the transceiver 108. This coupling provides signal transfer from a first port of the physics cell 102 to receiver circuitry (not shown) in the transceiver 108. Another port of the physics cell 102 is coupled to transmitter circuitry (not shown) of the transceiver 108.

The multilayer lead frame 110 includes a conductive reflector wall 150 that facilitates the use of a thin multilayer lead frame 110 where the thickness 118 is less than λ/4. The conductive reflector wall 150 in this example is formed by conductive features of the via levels 114 and 115 and of the second trace level 112. The conductive reflector wall 150 provides a conductive connection between the conductive first ground structure 121 in the first trace level 111 and the second conductive ground structure 123 of the third trace level 113. The conductive reflector wall 150 forms a wall that defines an interior having an X-direction width 151. The conductive reflector wall 150 is spaced apart from both respective sides of the conductive coupler antenna 120 along the first direction X by a gap distance 152.

As previously described, the conductive reflector wall 150 extends between the upper and lower ground planes and has a reflector wall thickness 119 along the third direction Z. The sum of the gap distance 152 and the reflector wall thickness 119 is greater than the lead frame thickness 118. In one implementation, the sum of the gap distance 152 and the reflector wall thickness 119 is equal to λ/4 (e.g., within manufacturing tolerances, such as 5%). This example provides efficient operation for signal transfer through the antenna coupling while allowing the overall Z-direction thickness 118 to be less than λ/4. The conductive reflector wall 150 has an opening 160 having a lateral (e.g., Y-direction) width 162, as shown in FIGS. 1 and 1C. The conductive reflector wall 150 extends along the third direction Z between the first trace level 111 and the second trace level 112, the conductive reflector wall 150 extending around a portion of the conductive coupler antenna 120. The conductive feed structure 140 extends along the first direction X through the opening 160 of the conductive reflector wall 150, as shown in the perspective and top views of FIGS. 1 and 1C. The conductive reflector wall 150 in the illustrated example extends along the third direction Z in the via level 114, the second trace level 112 and the second via level 115 between the first trace level 111 and the third trace level 113 as a continuous conductive (e.g., copper) structure that defines an interior, with only a single gap provided by the opening 160.

As the reflector wall thickness 119 is less than the overall coupler thickness 118, the Z direction distance 119 is less than λ/4 for an OCS or $H_2O$ physics cell gas. However, the conductive reflector wall structure provides lateral spacing by the gap distances 119 and 152 to accommodate the reduced thicknesses 118 and 119 while still providing adequate reflective distance within an interior of the reflective wall structure.

The antenna-in package solution provided by the multilayer lead frame 110 incorporates a lateral reflector and reduces thickness of the packaged electronic device 100 while reducing electromagnetic (EM) leakage and crosstalk. In one implementation, the conductive reflector wall 150 reduces propagation of EM signals laterally through the substrate of the package as well as the propagation through the glass layer 107, one of the main sources of leakage and crosstalk. In addition, the use of the conductive reflector wall 150 facilitates high frequency antennas in very thin substrates for a variety of applications, such as 5G, RADAR, internet of things (TOT) and other high frequency applications needing antennas in a simple and low-cost package solution using standard materials and providing a super thin product profile needed in many system applications.

In one implementation, the physics cell 102 is a 28×9 $mm^2$ chip-scale physics cell that includes the glass layer 107 and a silicon structure forming the top and sidewalls that define the cavity 103. The internal cavity 103 is bonded using an alloy of gold and indium (AuIn) to trap low pressure OCS gas. The multilayer lead frame 110 in this example is a multilayer package substrate with a lateral reflector provided by the reflector wall 150 to implement an integrated antenna coupling structure in very thin substrate, where the thickness 118 is only limited by design rules of the fabrication technology rather than by the operating signal wavelength λ. In this implementation, the first trace level 111 has a thickness along the third (Z) axis of approximately 35 μm+/−10 μm in a first trace level having a maximum etch back 5 μm, the second trace level 112 has a third axis thickness of 35 μm+/−10 μm, the third trace level 113 has a third axis thickness of 30 μm+/−10 μm, the first via level 114 has a third axis thickness of 35 μm, and the second via level 115 has a third axis thickness of 30 μm with a nominal etch back of 5 μm+/−5 μm. In one example, the bottom side 117 of the multilayer lead frame 110 includes a surface mount technology (SMT) stud thickness along the third axis of 30 μm+/−15 μm. In this implementation, the thickness 118 of the multilayer lead frame 110 before package molding processes is approximately 200 μm+/−30 μm. These example dimensions can vary with tolerance limitations of a particular fabrication process (e.g., +/−1%). As shown in FIGS. 1A and 1C, the conductive (e.g., copper) reflector wall 150 extends between the top and bottom ground planes and provides a lateral reflector for the signal from the conductive coupler antenna 120.

Other designs implement an antenna in the top layer and the reflector at λ/4 distance in the ground of the bottom layer, but require an overall thickness greater than λ/4, for example, greater than 400 to 500 um depending on the dielectric constant of the dielectric and the frequency of operation. As discussed above, certain application design specifications do not allow such large coupler substrate thicknesses, for example, where the maximum thickness allowed is 200 um. The provision of the conductive reflector wall 150 with appropriate spacing distances 119 and 152 around the conductive coupler antenna 120 operate as an effective lateral reflector and thus facilitate signal coupling efficiency with a package thickness 118 much smaller than λ/4.

Referring now to FIGS. 2-9, FIG. 2 shows a method 200 of fabricating a packaged electronic device, and FIGS. 3-9 show partial sectional side elevation views of the packaged electronic device 100 undergoing fabrication according to the method 200. The method 200 includes fabricating the multilayer lead frame 110 at 202. In one implementation, the lead frame 110 is fabricated one level at a time, beginning with fabrication of a starting core level, followed by fabrication of additional levels using copper or other conductive metal and insulator material, such as one or more Ajinomoto build-up film (ABF) layers. The lead frame fabrication 202 is described below as beginning with the first trace level 111 at 203 and proceeding with the sequential formation of the first via level 114, the second trace level 112, the second via level 115 and then the third trace level 113. In other implementations, different sequences can be used, for example, starting with an interior level and fabricating additional levels on either side of the starting (e.g., core) level. In certain implementations, certain trace levels include patterned conductive features with steps having features of different thicknesses (e.g., stepped copper features or traces of the first trace level 111), which can be formed by masked etch back processing.

At 203, the patterned first trace layer and insulator portion of the first trace level 111 are formed (e.g., also labeled M1 in FIG. 4). FIG. 3 shows the example first trace level 111 undergoing a single level fabrication process 300. The process 300 forms the first patterned conductive features including the conductive coupler antenna 120 and the conductive first ground structure 121 extending along respective portions of the first side 116 in a plane of the first and second directions (e.g., an X-Y plane), as well as the associated insulator portions 131 between the first patterned conductive features. As discussed above, the patterning of the first conductive features provides the X-direction width 151 and the gap distance 152 between lateral sides of the conductive coupler antenna 120 and the laterally inner edges of the conductive first ground structure 121 along the first direction X. The conductive coupler antenna 120 formed at 202 has a portion that faces outward from the first side 116 (e.g., downward in FIG. 3).

In one implementation, the single level process 300 uses Ajinomoto build-up film insulator layers of the insulator structure 131 that are adhered to the patterned conductive features by vacuum lamination, followed by thermal pre-curing and desired laser via formation and smear removal in the ABF laminate layer. A thin copper layer is plated on the ABF layer following optional deposition of a copper seed layer, and a photo resist layer is formed and patterned on the deposited copper to facilitate formation of stepped or planar copper structures in the fabricated first trace level 111. Thereafter, further copper deposition is performed, for example, using copper electroplating, and the patterned resist layer is then removed. The thin copper is then optionally etched, followed by full curing, for example, at 180 to 200 degrees C.

Similar processing is used in one example for the subsequent fabrication of the remaining levels 112-115 of the multilayer lead frame 110 in the lead frame fabrication at 202. Similar processing steps can be used in forming other multilayer lead frames, such as the three-level example in FIG. 10 below.

The method 200 continues at 204, where a patterned first via layer and insulator portion of the first via level 114 are formed on the finished side of the first trace level 111. FIG. 4 shows the example first via level 114 (e.g., also labeled V1 in FIG. 4) undergoing a single level fabrication process 400 that forms the first conductive vias 124 of the conductive reflector wall 150 and the conductive via 124 of the conductive feed structure 140, as well as the further insulator portion 134 between the first patterned conductive vias 124.

A patterned second trace layer and insulator portion of the second trace level 112 are formed at 205. FIG. 5 shows the example second trace level 112 undergoing a single level fabrication process 500 that forms the second patterned conductive features 122 of the conductive reflector wall 150 and the laterally extended portion of the conductive feed structure 140, as well as the associated insulator portion 132 between the second patterned conductive features.

At 206, the patterned second via layer and insulator portion of the second via level 115 are formed on the finished side of the second trace level 112. FIG. 6 shows the example second via level 115 undergoing another single level fabrication process 600 that forms the second conductive via or vias 125 of the conductive reflector wall 150 and the associated insulator portion 135.

At 208, the patterned third trace layer and insulator portion of the third trace level 113 are formed. FIG. 7 shows the example third trace level 113 undergoing a single level fabrication process 700 that forms the third patterned conductive features of the second conductive ground structure 123, for example, as a single planar copper layer.

The fabrication processing at 202 provides formation of portions of the conductive feed structure 140 in one of the first trace level 111 and the first via level 114, in which the conductive feed structure 140 coupled to the conductive coupler antenna 120 and extends along the first direction X. In the five-level example, the processing at 202 includes forming the further portion of the conductive feed structure 140 in the second trace level 112 of the multilayer lead frame 110. The processing at 202 also provides formation of the conductive reflector wall 150 with the opening 160, where the conductive reflector wall 150 in the illustrated example includes a stack of the conductive first via(s) 124, conductive structure(s) 122 and conductive second vias 125 that extends along the third direction Z between the first trace level 111 and the third trace level 113. The conductive reflector wall 150, moreover, extends around a portion of the conductive coupler antenna 120 (e.g., as shown in FIGS. 1 and 1C above), and the conductive feed structure 140 extends along the first direction X through the opening 160 of the conductive reflector wall 150.

In another implementation, the conductive feed structure 140 is constructed as part of the first trace level 111 at 203 in FIG. 2, and the processing at 206 and 208 can be omitted, for example, to fabricate a three-level lead frame structure as discussed below in connection with FIG. 10. In another implementation, further processing is included to form further trace and/or via levels after 208 in the method 200.

Figure 2:
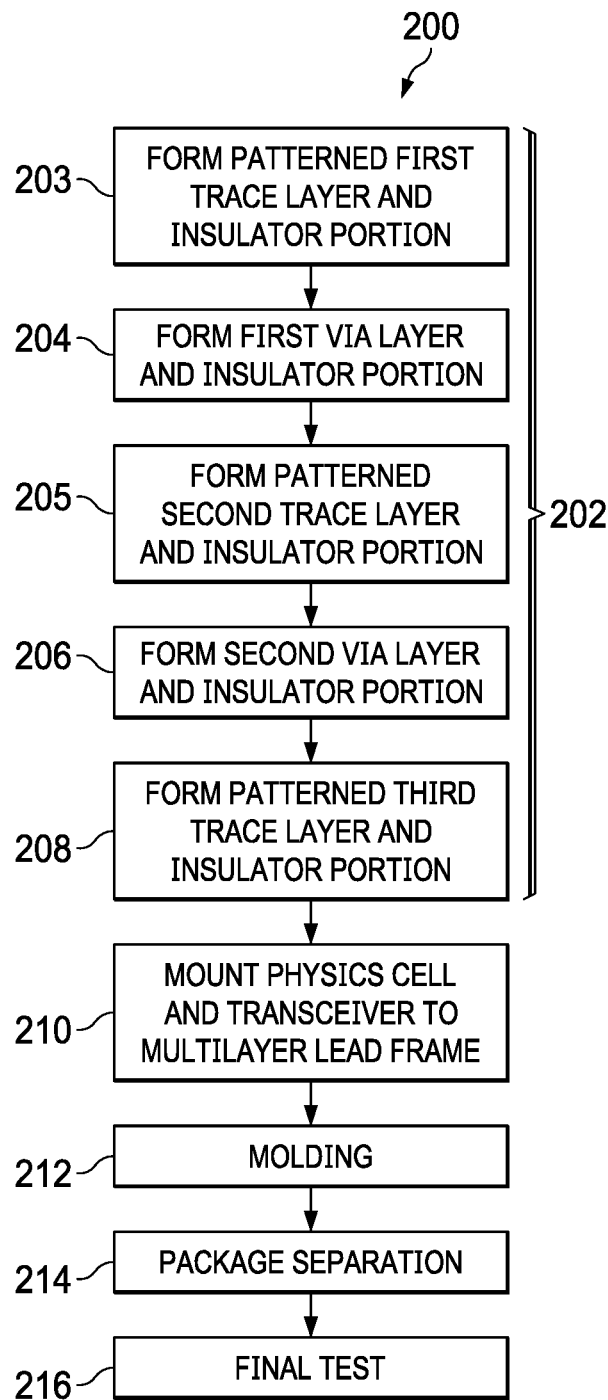
FIG. 2 is a flow diagram of a method of fabricating a packaged electronic device.
Figure 8:
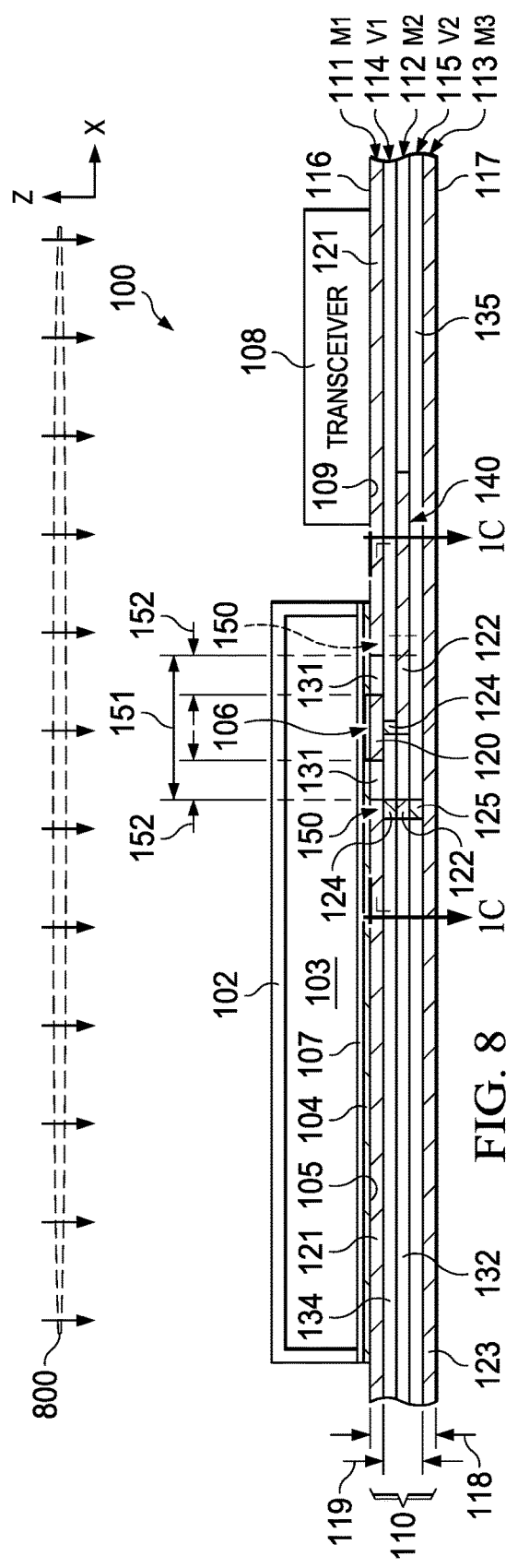

After fabrication of the multilayer lead frame 110 at 202, the method 200 continues at 210 in FIG. 2 with mounting (e.g., soldering) one or more electronic components or subassemblies to associated first conductive features of the first trace level 111. In one example, this includes mounting the physics cell 102 and the transceiver 108 to the first side 116 of the multilayer lead frame 110. FIG. 8 shows the electronic device 100 undergoing a component attachment process 800 that provides solder paste to select areas (e.g., conductive landing pads, not shown) on or along the top side 116 of the multilayer lead frame 110, followed by automated pick and place operations to place the physics cell 102 and the transceiver 108 on the associated conductive landing pads. The solder paste is then thermally reflowed to create solder connections between the component terminals and the sop sides of the conductive landing pads at 210.

Figure 9:
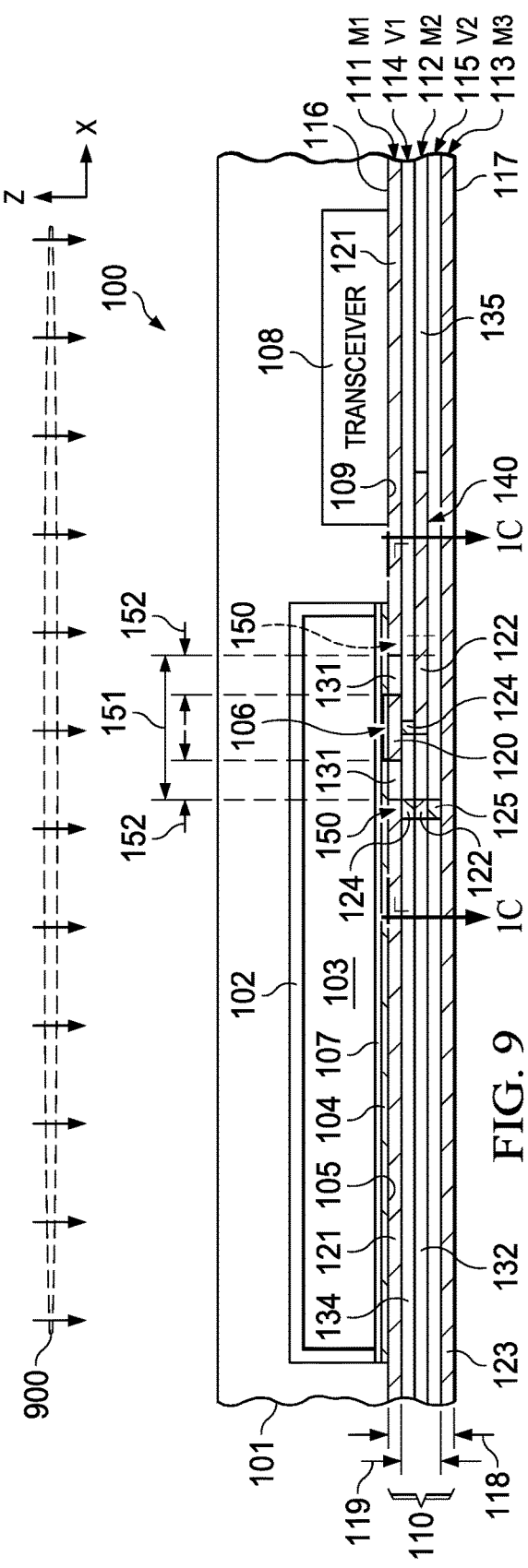

A package structure 101 is formed at 212, for example, via a molding process 900 shown in FIG. 9, to enclose the physics cell 102 and the transceiver 108. In one implementation, the upper portions of the electronic device 100 are molded at 212 using a molding compound to form the package structure 101. The illustrated method 200 also includes optional package separation at 214, for example, orthogonal package sawing operations to separate individual finished electronic devices from a starting panel lead frame structure, and the method 200 concludes with final device testing at 216.

Figure 10C:
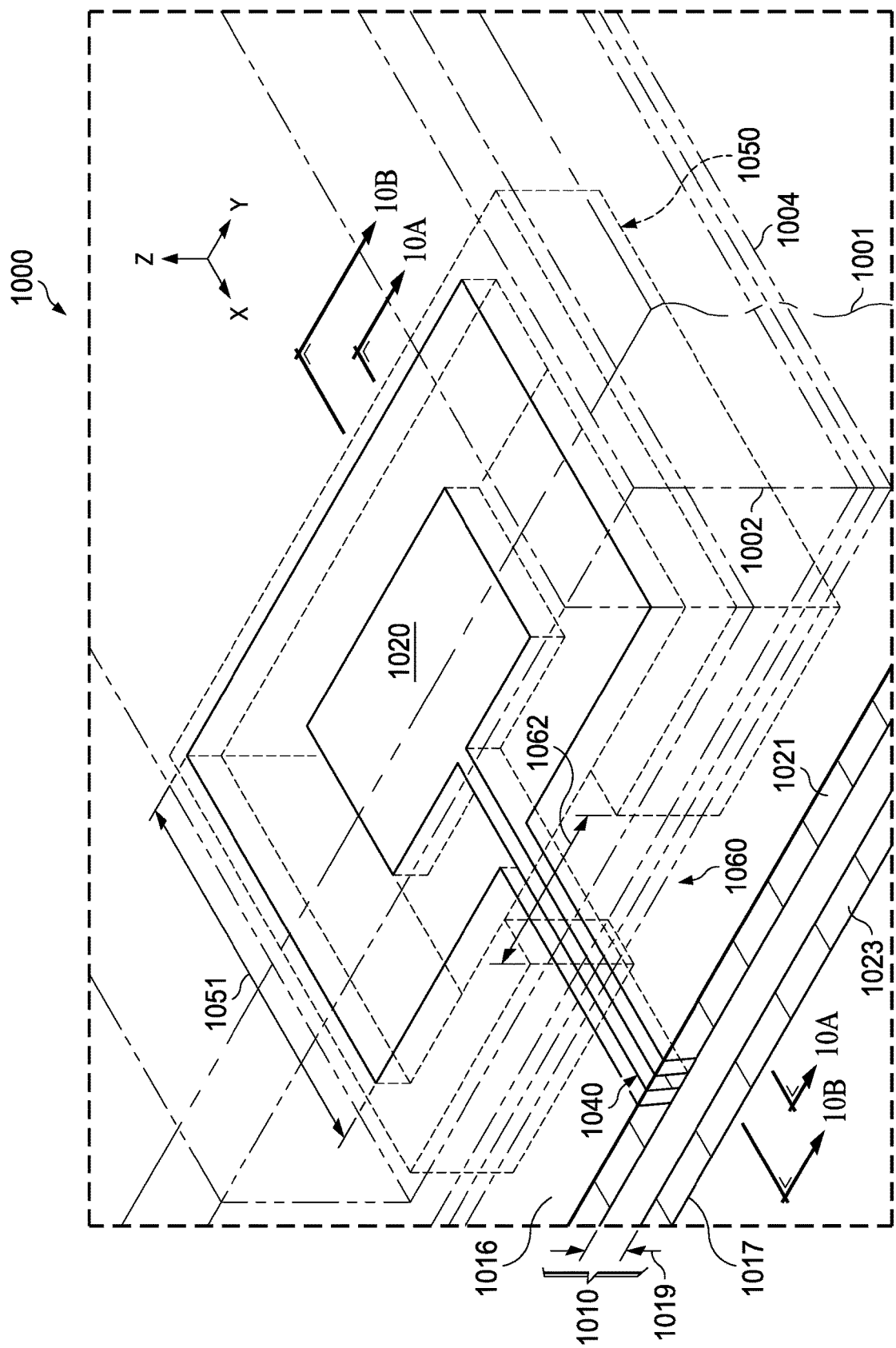
FIG. 10C is a perspective view of a portion of the packaged electronic device in FIGS. 10, 10A and 10B.

FIGS. 10 and 10A-10C show another mm wave clock packaged electronic device 1000 with a multilayer lead frame coupler. This example uses a three-level lead frame, which facilitates further size reduction by incorporating a conductive reflector wall. FIG. 10 shows a perspective view of the packaged electronic device 1000, FIG. 10A is a partial sectional side elevation view taken along line 10A-20A in FIG. 10, FIG. 10B is a partial sectional side elevation view taken along line 10B-10B in FIG. 10 and FIG. 10C is a perspective view of a portion of the packaged electronic device in FIGS. 10, 10A and 10B.

Portions of the packaged electronic device 1000 are enclosed by a package structure 1001, which can be a molded plastic material. The packaged electronic device 1000 has a generally rectangular shape and is shown in the three-dimensional X, Y, Z space. The packaged electronic device 1000 includes a physics cell 1002 (e.g., FIGS. 10A and 10B) with a cavity 1003 and a conductive layer 1004 along a bottom side 1005 of the physics cell 1002. The conductive layer 1004 has an opening 1006 (e.g., an iris) along the bottom and a glass layer 1007, shown in FIGS. 10A and 10B. The physics cell 1002 in one example includes a semiconductor material, which can be or include silicon, with the cavity 1003 formed therein. The physics cell 1002 includes one or more metallization layers or levels that include(s) the conductive layer 1004 and the opening 1006 thereof. The packaged electronic device 1000 has a transceiver 1008 with a bottom side 1009.

The packaged electronic device 1000 includes a three-level multilayer lead frame 1010, which can be a routable lead frame. The multilayer lead frame 1010 provides an integral antenna that couples a signal from the transmitter output of the transceiver 1008 to a first port of the physics cell 1002 and couples a second port of the physics cell 1002 to receiver circuitry of the transceiver 1008. The packaged electronic device 1000 is configured to operate as a rotational transition based atomic clock that uses quantum defined rotational states of a dipolar molecule vapor in the cavity 1003 of the physics cell 1002. The rotational states of the cavity gas occur at frequencies (e.g., 10 to 1000 GHz) in the mm wavelength range, and do not require optical components such as lasers, photo detectors, and lenses. In one example, the transceiver 1008 is a low-cost mm wave CMOS transceiver that is configured to interrogate the physics cell 1002 over a bandwidth which covers the corresponding quantum state transition. At the transition frequency, a detectable absorption minima determines an absolute frequency reference.

The multilayer lead frame 1010 in FIGS. 10-10C is a three-level structure including a first trace level 1011 (e.g., a first metal layer M1), a second trace level 1012 (e.g., a second metal layer M2) and a first via level 1014 (e.g., V1). In one example, the patterned conductive features of the trace levels and conductive vias of the via level are or include copper or other conductive metal. The multilayer lead frame 1010 in FIGS. 10-10C has a first (e.g., top) side 1016 and an opposite second (e.g., bottom) side 1017. The respective bottom sides 1005 and 1009 of the physics cell 1002 and the transceiver 1008 are mounted to the first side 1016 of the multilayer lead frame 1010.

The packaged electronic device 1000 includes conductive leads (not shown) that can be soldered to corresponding conductive pads of a host PCB (not shown) to mechanically mount the packaged electronic device 1000 and to form electrical connections between circuitry of the PCB and one or more circuits or components of the packaged electronic device 1000. In another implementation, the packaged electronic device includes one or more conductive leads exposed in the interior of the bottom side, such as in a grid array type (e.g., LGA or BGA) package. The multilayer lead frame 1010 further includes an insulator in one or more levels thereof, such as multiple layers of Ajinomoto build-up film (ABF), for example 2-5 μm silica layers with epoxies.

The physics cell 1002 and the transceiver 1008 are configured to operate at a signal wavelength λ, which can be varied by a controller or processor (not shown) of the transceiver 1008. The multilayer lead frame 1010 has a lead frame thickness 1018 along the third direction Z that is less than the signal wavelength λ/4. In one example, the lead frame thickness 1018 along the third direction Z is less than 250 μm, such as about 170 to 230 μm. The example three-level multilayer lead frame 1010 includes a conductive reflector wall structure to provide adequate atomic clock operating efficiency while achieving a significantly reduced coupler thickness 1018 and allowing operation at mm wave frequencies, e.g., at or around 183 GHz for an $H_2O$ physics cell gas, 121 GHz for an OCS physics cell gas.

The multilayer lead frame 1010 has conductive upper and lower ground planes separated from one another by a distance 1019. The first trace level 1011 has first patterned conductive features, including a conductive coupler antenna 1020 (e.g., a patch antenna), a conductive first ground structure 1021 and a conductive feed structure 1040. The conductive feed structure 1040 in one example is a coplanar waveguide (CPW) configuration. The conductive coupler antenna 1020, the conductive first ground structure 1021 and the conductive feed structure 1040 extend along respective portions of the first side 1016 in an X-Y plane. The conductive coupler antenna 1020 has a portion that faces the opening 1006 of the conductive layer 1004 of the physics cell 1002 along the third direction Z. The second trace level 1012 has second patterned conductive features 1022 that form a conductive second ground structure 1022 that provides a second ground plane that extends along the second side 1017. The first via level 1014 extends between the first trace level 1011 and the second trace level 1012. The first via level 1014 includes conductive first vias 1024 that interconnect respective ones of the first and second patterned conductive features to form a conductive reflector wall 1050. The second conductive ground structure 1022 extends along the second side 1017 of the multilayer lead frame 1010. The first conductive ground structure 1021 and the second conductive ground structure 1022 are parallel to one another. In one implementation, the first trace level 1011 includes one or more insulator (e.g., dielectric) portions 1031 and the first via level 1014 includes one or more insulator portions 1034.

The conductive feed structure 1040 is spaced apart from the conductive ground structure 1021 in the first trace level 1011. The conductive feed structure 1040 is configured to couple a signal at a port of the physics cell 1002 from the conductive coupler antenna 1020 to the transceiver 1008. This coupling provides signal transfer from a first port of the physics cell 1002 to receiver circuitry (not shown) in the transceiver 1008. Another port of the physics cell 1002 is coupled to transmitter circuitry (not shown) of the transceiver 1008.

The conductive reflector wall 1050 in this example is formed of one or more conductive vias 124 of the vial level 114 and facilitates the use of a thin multilayer lead frame 1010 where the thickness 1018 is less than $\lambda/4$. The conductive reflector wall 1050 provides a conductive connection between the conductive first ground structure 1021 in the first trace level 1011 and the second conductive ground structure 1022 of the second trace level 1012. The conductive reflector wall 1050 forms a wall that defines an interior having an X-direction width 1051 (e.g., FIGS. 10 and 10C), and the conductive reflector wall 1050 is spaced apart from both respective sides of the conductive coupler antenna 1020 along the first direction X by a gap distance 1052. The sum of the gap distance 1052 and the reflector wall thickness 1019 is greater than the lead frame thickness 1018. In one implementation, the sum of the gap distance 1052 and the reflector wall thickness 1019 is equal to $\lambda/4$ (e.g., within manufacturing tolerances, such as 5%). This coupler design facilitates efficient signal transfer through the antenna coupling while allowing the overall Z-direction thickness 1018 to be less than $\lambda/4$.

The conductive reflector wall 1050 has an opening 1060 with a lateral (e.g., Y-direction) width 1062 as shown in FIGS. 10 and 10C. The conductive reflector wall 1050 extends along the third direction Z in the first trace level 1011 and the via level 1014. The conductive reflector wall 1050 extends along the third direction Z between the first trace level 1011 and the second trace level 1012 and extends laterally around a portion of the conductive coupler antenna 1020. The conductive feed structure 1040 extends along the first direction X through the opening 1060 of the conductive reflector wall 1050, as shown in the perspective and top views of FIGS. 10 and 10C. The conductive reflector wall 1050 in the illustrated example extends along the third direction Z in the via level 1014 between the first trace level 1011 and the second trace level 1012 as a continuous conductive (e.g., copper) structure that defines an interior, with one gap provided by the opening 1060. In this example, the Z direction distance 1019 is less than $\lambda/4$ for an OCS or $H_2O$ physics cell gas, and the conductive reflector wall 1050 provides lateral spacing by the gap distances 1019 and 1052 to accommodate the reduced thickness 1018 while still providing adequate reflective distance within the interior of the conductive reflector wall 150. Moreover, the example three-level design of FIG. 10 provides the above-described advantages associated with the device 100 of FIG. 1, while allowing further reduction in the lead frame thickness 118 and providing additional cost benefits.

In one implementation, the physics cell 1002 is a 28×9 $mm^2$ chip-scale physics cell that includes the glass layer 1007 and a silicon structure forming the top and sidewalls that define the cavity 1003. The internal cavity 1003 is bonded using an alloy of gold and indium (AuIn) to trap low pressure OCS gas. The multilayer lead frame 1010 in this example is a multilayer package substrate with a lateral reflector provided by the reflector wall 1050 to implement an integrated antenna coupling structure in a very thin substrate, where the thickness 1018 is only limited by design rules of the fabrication technology rather than by the operating signal wavelength $\lambda$. In one implementation, the distance between the upper and lower ground planes (e.g., the thickness of the via level 114 along the third direction Z) can be substantially smaller than $\lambda/4$, particularly where the sum of the distances 1019 and 1052 is approximately equal to $\lambda/4$, such as within manufacturing tolerances (e.g., 1%). In one example, the operating frequency is around 121.6 GHz, the dielectric constant of the insulator materials 1031 and 1034 is 3.1, $\lambda$ is 1.43 mm, $\lambda/4=358$ µm, the vertical distance 1019 is 135 µm and the gap distance 1052 is 230 µm and the sum is 365 µm. In one example, the first trace level 1011 has a thickness along the third (Z) axis of approximately 40 µm+/−10 µm in a first trace level with an etch back maximum of 5 µm, the second trace level 1012 has a third axis thickness of 40 µm+/−10 µm.

In another example, the lead frame has two trace levels interleaved with two via levels, with the patch antenna in the first trace level, the conductive feed structure in the first via level and the lower ground in the second via level, in which the first via level has a third axis thickness of 40 µm+/−10 µm with a nominal etch back of 5 µm+/−5 µm, and the first via level has a third axis thickness of 65 µm. The second trace level has a third axis thickness of 40 µm+/−10 µm, the second via level has a third axis thickness of 65 µm and a nominal etch back of 5 µm+/−5 µm. In one example, the lead frame includes a stud level with a SMT stud third axis thickness of 30 µm+/−15 µm. In this implementation, the thickness of the multilayer lead frame before package molding processes is approximately 200 µm+/−25 µm. These example dimensions can vary with tolerance limitations of a particular fabrication process (e.g., +/−1%).

Figure 11:
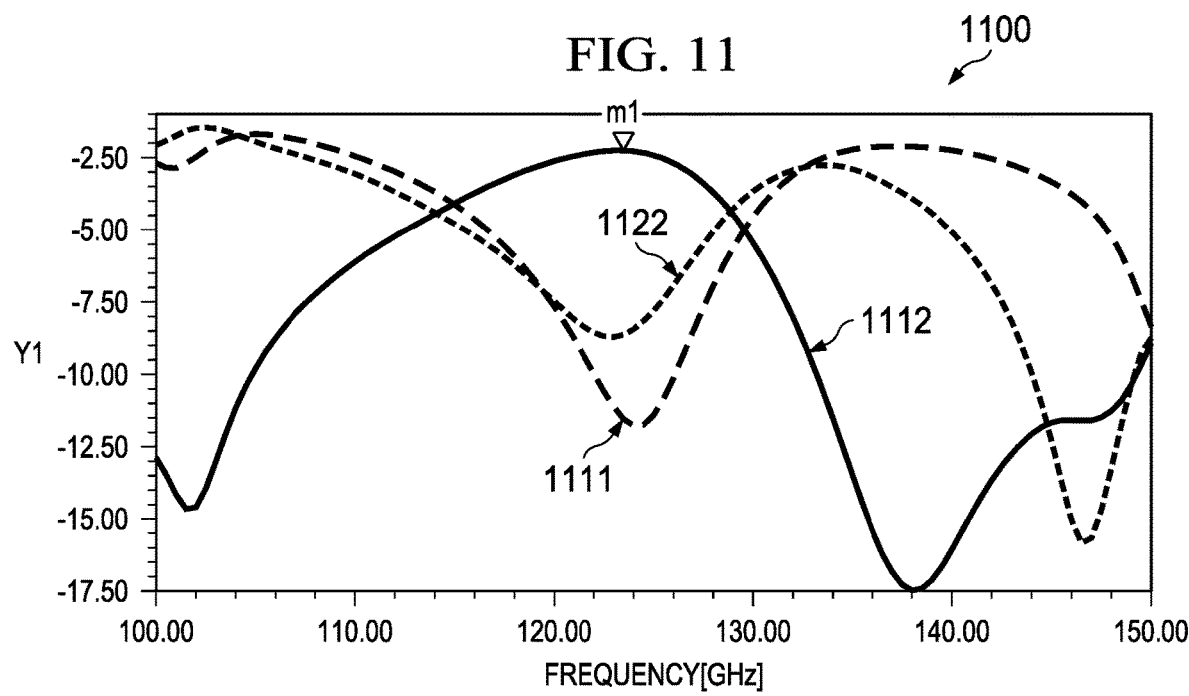
FIG. 11 is a signal diagram of simulated S-parameter signals in the packaged electronic device of FIGS. 1-1C.

FIG. 11 shows a signal diagram 1100 of simulated S-parameter signals in the packaged electronic device 100 of FIGS. 1-1C, including an $S_{11}$ curve 1111, an $S_{12}$ curve 1112 and an $S_{22}$ curve 1122 for a package-cell HFSS simulation of the first and second ports of the physics cell 102. The signal 1112 (S12) of −2.2 dB shows good insertion loss at a frequency of interest (e.g., around 121.6 GHz) and the curve 1111 (S11) shows good return loss in the desired band around 121 GHz.

Figure 12:
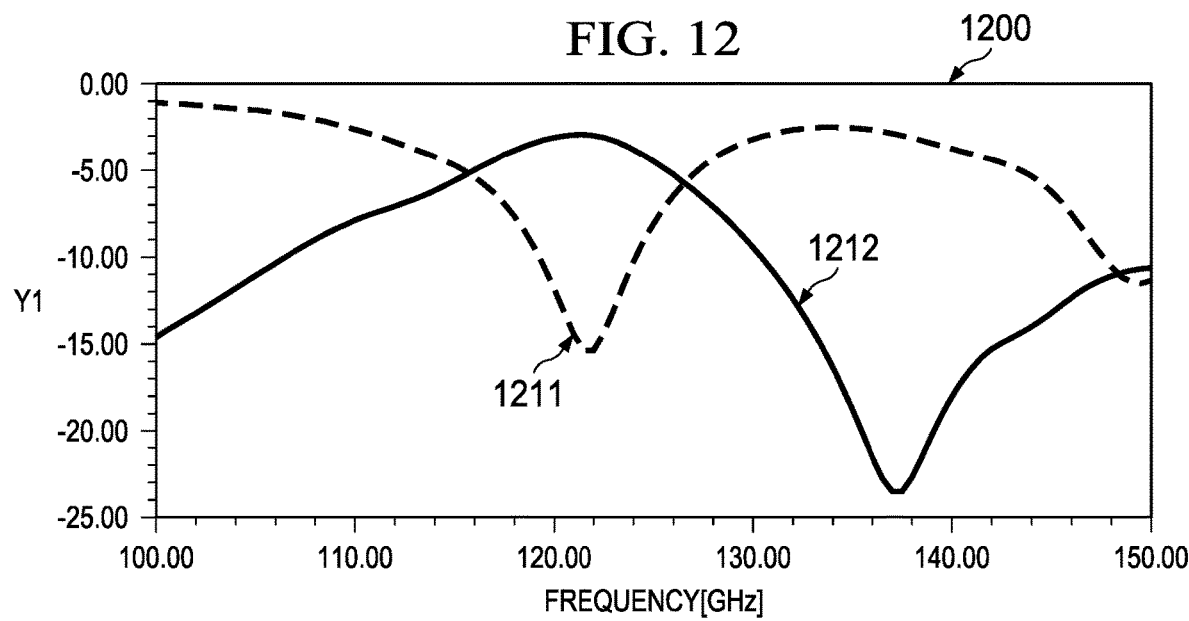
FIG. 12 is a signal diagram of simulated S-parameter signals in the packaged electronic device of FIGS. 10-10C.

FIG. 12 shows a signal diagram 1200 of simulated S-parameter signals in the packaged electronic device 1000 of FIGS. 10-10C, including an $S_{11}$ curve 1211 and an $S_{12}$ curve 1212 with similar good performance results at the frequency of interest (e.g., around 121.6 GHz).

Described examples provide improved packaging arrangements for atomic clock devices, in which the physics cell 102, 1002 is interrogated by a mm-wave patch antenna implemented in a low-cost multilayer lead frame 110, 1010 with a package substrate having a thickness less than λ/4. The described solutions can be implemented in a wide array of antenna-on-package packaging solutions including 5G, RADAR, automotive, IOT and many more applications. The use of the vertical package metallization (wall between top and bottom ground) at the proper distance from the patch antenna creates a shallow mm-wave reflector for optimum antenna performance. The same vertical package metallization with the conductive reflector wall 150, 1050 provides a lateral reflector (e.g., lateral wall) that reduces the propagation of mm-wave signal leakage in the glass layer 107, 1007 of the physics cell 102 and the package itself to mitigate or avoid crosstalk issues.

Modifications are possible in the described examples, and other implementations are possible, within the scope of the claims.

What is claimed is:

1. A packaged electronic device, comprising:
a physics cell having a cavity and a conductive layer along a side of the physics cell, the conductive layer having an opening;
a transceiver having a side; and
a multilayer lead frame having a first side, an opposite second side, a first trace level, a second trace level, a via level, a conductive feed structure and a conductive reflector wall;
the first trace level including a conductive coupler antenna and a conductive ground structure that extends along the first side in a plane of a first direction and a second direction, the first direction orthogonal to the second direction, the conductive coupler antenna having a portion thereof that faces the opening of the conductive layer of the physics cell along a third direction, the third direction orthogonal to the first direction and the second direction;
the conductive reflector wall having an opening, the conductive reflector wall extending along the third direction between the first trace level and the second trace level, the conductive reflector wall extending around a portion of the conductive coupler antenna; and
the conductive feed structure coupled to the conductive coupler antenna and to the transceiver, the conductive feed structure extending along the first direction through the opening of the conductive reflector wall.

2. The packaged electronic device of claim 1, wherein the conductive feed structure extends in the second trace level along the first direction through the opening of the conductive reflector wall.

3. The packaged electronic device of claim 2, wherein: the via level extends between the first trace level and the second trace level;

the multilayer lead frame further comprises a third trace level and a second via level, the second via level extends between the second trace level and the third trace level; and
the conductive reflector wall extends along the third direction in the via level, the second trace level and the second via level between the first trace level and the third trace level.

4. The packaged electronic device of claim 3, wherein:
the third trace level includes a second conductive ground structure that extends in a second plane of the first direction and the second direction; and
the conductive ground structure and the second conductive ground structure are parallel to one another.

5. The packaged electronic device of claim 3, wherein the second conductive ground structure extends along the second side.

6. The packaged electronic device of claim 1, wherein:
the conductive feed structure extends in the first trace level along the first direction through the opening of the conductive reflector wall; and
the conductive reflector wall extends along the third direction in the first trace level and the via level.

7. The packaged electronic device of claim 6, wherein the conductive feed structure is spaced from the conductive ground structure in the first trace level.

8. The packaged electronic device of claim 7, wherein the second conductive ground structure extends in the second trace level along the second side.

9. The packaged electronic device of claim 1, wherein:
the physics cell and the transceiver are configured to operate at a signal wavelength; and
the multilayer lead frame has a lead frame thickness along the third direction that is less than the signal wavelength divided by 4.

10. The packaged electronic device of claim 9, wherein:
the conductive reflector wall is spaced from the conductive coupler antenna along the first direction by a gap distance;
the conductive reflector wall has a reflector wall thickness along the third direction; and
a sum of the gap distance and the reflector wall thickness is greater than the lead frame thickness.

11. The packaged electronic device of claim 10, wherein the sum of the gap distance and the reflector wall thickness is equal to the signal wavelength divided by 4.

12. The packaged electronic device of claim 1, wherein:
the physics cell and the transceiver are configured to operate at a signal wavelength;
the conductive reflector wall is spaced from the conductive coupler antenna along the first direction by a gap distance;
the conductive reflector wall has a reflector wall thickness along the third direction; and
the sum of the gap distance and the reflector wall thickness is equal to the signal wavelength divided by 4.

13. A multilayer lead frame, comprising:
opposite first and second sides;
a first trace level having first patterned conductive features;
a second trace level having second patterned conductive features;
a via level between the first trace level and the second trace level, the via level including conductive vias that interconnect respective ones of the first and second patterned conductive features;
a conductive feed structure; and a conductive reflector wall;

the first trace level including a conductive coupler antenna and a conductive ground structure that extends along the first side in a plane of a first direction and a second direction, the first direction orthogonal to the second direction, the conductive coupler antenna having a portion thereof that faces outward from the first side along a third direction, the third direction orthogonal to the first direction and the second direction;

the conductive reflector wall having an opening, the conductive reflector wall extending along the third direction between the first trace level and the second trace level, the conductive reflector wall extending around a portion of the conductive coupler antenna; and the conductive feed structure coupled to the conductive coupler antenna, the conductive feed structure extending along the first direction through the opening of the conductive reflector wall.

14. The multilayer lead frame of claim 13, wherein the conductive feed structure extends in the second trace level along the first direction through the opening of the conductive reflector wall.

15. The multilayer lead frame of claim 13, wherein:

the conductive feed structure extends in the first trace level along the first direction through the opening of the conductive reflector wall; and the conductive reflector wall extends along the third direction in the first trace level and the via level.

16. The multilayer lead frame of claim 13, wherein the multilayer lead frame has a lead frame thickness along the third direction that is less than 250 µm.

17. The multilayer lead frame of claim 13, wherein:

the conductive reflector wall is spaced from the conductive coupler antenna along the first direction by a gap distance;

the conductive reflector wall has a reflector wall thickness along the third direction; and the sum of the gap distance and the reflector wall thickness is greater than a lead frame thickness of the multilayer lead frame.

18. A method of fabricating a packaged electronic device, the method comprising:

forming a first trace level of a multilayer lead frame, the first trace level having first patterned conductive features and an insulator portion between the first patterned conductive features, the first patterned conductive features including a conductive coupler antenna and a conductive ground structure that extends in a plane of a first direction and a second direction, the first direction orthogonal to the second direction, the conductive coupler antenna having a portion thereof that faces outward from a first side of the multilayer lead frame along a third direction, the third direction orthogonal to the first direction and the second direction;

forming a via level of the multilayer lead frame on the first trace level, the via level having conductive vias and another insulator portion between the conductive vias;

forming a second trace level of the multilayer lead frame on the via level, the second trace level having second patterned conductive features and a further insulator portion between the second patterned conductive features;

forming a conductive feed structure in one of the first trace level and the via level of the multilayer lead frame, the conductive feed structure coupled to the conductive coupler antenna, the conductive feed structure extending along the first direction; and forming a conductive reflector wall having an opening, the conductive reflector wall extending along the third direction between the first trace level and the second trace level, the conductive reflector wall extending around a portion of the conductive coupler antenna, and the conductive feed structure extending along the first direction through the opening of the conductive reflector wall.

19. The method of claim 18, further comprising:

mounting a physics cell and a transceiver to the first side of the multilayer lead frame; and forming a package structure that encloses the physics cell and the transceiver.

20. The method of claim 18, comprising forming the conductive feed structure in the via level of the multilayer lead frame.

* * * * *